United States Patent
Byagowi et al.

(10) Patent No.: US 10,854,532 B1
(45) Date of Patent: Dec. 1, 2020

(54) COMPRESSED AIR AND LATTICE STRUCTURE COOLING

(71) Applicant: Facebook, Inc., Menlo Park, CA (US)

(72) Inventors: Ahmad Byagowi, Fremont, CA (US); Spencer John Paul Burns, Hayward, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 16/378,226

(22) Filed: Apr. 8, 2019

(51) Int. Cl.
| | |
|---|---|
| *H01L 23/46* | (2006.01) |
| *H01L 23/467* | (2006.01) |
| *H05K 7/20* | (2006.01) |
| *F25B 9/04* | (2006.01) |

(52) U.S. Cl.
CPC .............. *H01L 23/467* (2013.01); *F25B 9/04* (2013.01); *H05K 7/20154* (2013.01); *H05K 7/20172* (2013.01); *H05K 7/20727* (2013.01); *H05K 7/20745* (2013.01); *H05K 7/20836* (2013.01)

(58) Field of Classification Search
CPC .............. H01L 23/467; H05K 7/20154; H05K 7/20172; H05K 7/20727; H05K 7/20745; H05K 7/20836; H05K 1/0203; H05K 1/0272; F28D 15/0233; F28D 15/04; F28F 13/06; F28F 13/08; F28F 13/12; F25B 9/04
USPC ...................................................... 361/679.5
See application file for complete search history.

(56) References Cited

U.S. PATENT DOCUMENTS

| | | | | |
|---|---|---|---|---|
| 5,566,377 | A * | 10/1996 | Lee | G06F 1/20 |
| | | | | 165/80.3 |
| 5,583,316 | A * | 12/1996 | Kitahara | F28D 15/0275 |
| | | | | 174/16.3 |
| 6,330,153 | B1 * | 12/2001 | Ketonen | H05K 7/20145 |
| | | | | 165/104.33 |
| 7,477,516 | B2 | 1/2009 | Joshi | |
| 7,751,188 | B1 * | 7/2010 | French | H05K 7/20736 |
| | | | | 165/104.33 |
| 8,208,250 | B2 | 6/2012 | Mongia | |
| 8,726,681 | B2 | 5/2014 | Williams | |
| 2002/0062650 | A1 | 5/2002 | Dukhan | |
| 2003/0053293 | A1 * | 3/2003 | Beitelmal | H05K 7/20836 |
| | | | | 361/679.49 |
| 2008/0315402 | A1 * | 12/2008 | Hwang | H05K 1/0203 |
| | | | | 257/712 |
| 2009/0000773 | A1 | 1/2009 | Levy | |
| 2010/0024445 | A1 | 2/2010 | Cichanowicz | |
| 2013/0058042 | A1 * | 3/2013 | Salamon | F28D 15/02 |
| | | | | 361/700 |
| 2015/0208554 | A1 | 7/2015 | Leigh | |
| 2015/0327353 | A1 | 11/2015 | Dickover | |
| 2016/0270254 | A1 | 9/2016 | Brianese | |
| 2017/0241676 | A1 | 8/2017 | Kim | |
| 2019/0021186 | A1 * | 1/2019 | Poltorak | H01L 23/367 |

* cited by examiner

*Primary Examiner* — Mandeep S Buttar
(74) *Attorney, Agent, or Firm* — Van Pelt, Yi & James LLP (57) ABSTRACT

Compressed air and lattice structure cooling is disclosed. In an embodiment, an assembly includes a heat conductive lattice structure with open-cell voids. The assembly also includes a port configured to provide compressed air that is directed toward the heat conductive lattice structure. The assembly also includes a base configured to be coupled to an electronic component and thermally coupled to the heat conductive lattice structure.

20 Claims, 7 Drawing Sheets

COMPRESSED AIR AND LATTICE STRUCTURE COOLING

BACKGROUND OF THE INVENTION

The performance of electronic components such as computer chips is affected by the operating temperature of the electronic components. If the electronic components are not being cooled sufficiently, they do not perform as efficiently. The heat generated by electronic components has increased as electronic components (e.g., central processing units) have become more powerful. Data centers include server racks that have various electronic components that generate heat. This heat can significantly degrade the performance of data centers, e.g., causing request handling to be slow, consuming large amounts of energy, and causing components to malfunction prematurely.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Electronic components, such as central processing units (CPUs) and graphics processing units (GPUs), generate significant amounts of heat during normal operation. Performance of electronic components suffers when this heat is not dissipated. Thus, cooling systems are required for electronic components (e.g., electronic components in data centers). However, existing cooling systems have drawbacks. For example, liquid cooling is not ideal for settings such as data centers because of the tendency of liquid cooling systems to leak. Thus, it would be beneficial to develop improved cooling systems and thermal management methods for electronic components (e.g., in data center settings).

A compressed air and lattice structure cooling assembly is disclosed. The disclosed assembly comprises a heat conductive lattice structure with open-cell voids, a port configured to direct compressed air toward the heat conductive lattice structure, and a base configured to be coupled to an electronic component (to be cooled) and thermally coupled to the heat conductive lattice structure. A practical and technological benefit of the invention disclosed herein is more efficient cooling of electronic components, which would allow for improved performance of electronic components. A potential advantage of the heat conductive lattice structure (e.g., over other structures, such as traditional fins) is increased surface area for heat transfer.

In some embodiments, a heat conductive lattice structure with open-cell voids (also referred to herein as a heat conductive lattice structure, heat conductive lattice, lattice structure, etc.) is made from aluminum or an alloy thereof. In some embodiments, buildup of aluminum oxide, which does not conduct heat as well as aluminum, is removed from the heat conductive lattice structure (e.g., by acid etching). The heat conductive lattice structure may also be plated (e.g., with nickel, chrome, etc.). Materials other than aluminum may also be used to make the heat conductive lattice structure (e.g., copper, diamond, synthetic diamond, diamond copper-tungsten, silicon carbide in an aluminum matrix, diamond in a copper-silver alloy matrix, beryllium oxide in a beryllium matrix, etc.). Aluminum and these other materials have high thermal conductivity, allowing for efficient conduction transfer of heat.

In various embodiments, the heat conductive lattice structure is thermally coupled to a base that is coupled to an electronic component to be cooled. For example, the electronic component may be a computer chip attached to a circuit board with the heat conductive lattice structure resting on top of the base and enclosing the electronic component. In some embodiments, the heat conductive lattice structure is attached to the base using at least one point of contact to limit and/or prevent movement of the heat conductive lattice structure. In various embodiments, compressed air is directed toward and forced through the heat conductive lattice structure to cool the electronic component.

In some embodiments, an air flow spreader is placed on top of the heat conductive lattice structure and compressed air first passes through the air flow spreader before being forced through the heat conductive lattice structure. As illustrated and described in detail herein, in some embodiments, the air flow spreader is what is referred to herein as a fractal spreader. In various embodiments, the fractal spreader has at least one inlet port to receive compressed air to be distributed to multiple outlet ports for delivery to the heat conductive lattice structure. In some embodiments, the fractal spreader has air flow pathways in an H-fractal pattern (e.g., a pattern constructed by starting with line segments corresponding to a capital letter H and then iteratively placing smaller Hs centered at the top and bottom of each free vertical segment) such that the outlet port locations correspond to the top and bottom of each free vertical segment of each of the smallest Hs in the H-fractal pattern.

In some embodiments, compressed air is first supplied to a vortex tube. As described in further detail herein, in various embodiments, the vortex tube is configured to spin the compressed air, separating it into a hot stream to be vented as exhaust and a cold stream to be delivered for cooling purposes. In various embodiments, use of the vortex tube results in a relatively small pressure loss of the compressed air in exchange for a significant decrease in temperature of the compressed air, allowing for more efficient cooling of the electronic component.

Figure 1:
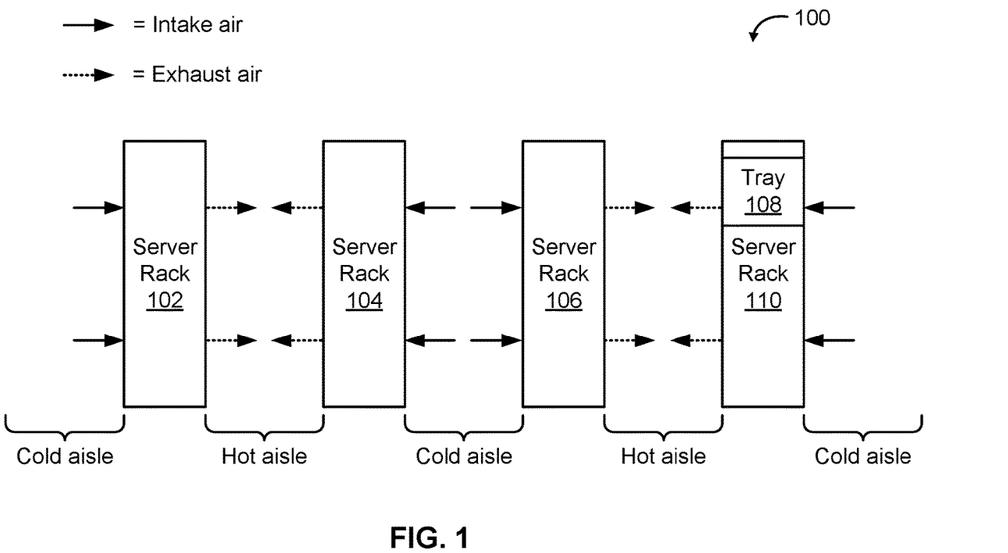
FIG. 1 shows an example of a data center in which the compressed air and lattice structure cooling techniques described herein can be applied.

FIG. 1 shows an example of a data center in which the compressed air and lattice structure cooling techniques described herein can be applied. Data centers house network infrastructure devices such as server racks. In various embodiments, a server rack comprises a stack of network racks (also called trays), which are further described in FIG. 2. When a user visits a web page, uses an application, or otherwise interacts with an Internet-based service, the user's requests can be handled by data centers. There have been efforts to standardize server racks. For example, the Open Compute Project's Open Rack V2 sets specifications and design guidelines for rack dimensions, rack-mounted components, and the like. The compressed air and lattice structure cooling techniques described below can be applied to cool a variety of electronic components, such as integrated circuit chips, including those in server racks complying with the Open Rack V2 specification.

Data center 100 includes four servers 102, 104, 106, and 110. In the example shown, the aisles between the servers are designated cold aisles or hot aisles because the air in the aisle is relatively cooler in the cold aisles and relatively hotter in the hot aisles. In the example shown, air is taken into a server rack from a cold aisle and exhaust air is expelled into a hot aisle. This helps to cool or at least prevent overheating of electronic components inside the server racks. Cold air can be supplied by output of an air conditioning system or a compressed air source as further described with respect to FIG. 3. In this example configuration, the aisles between server racks 102 and 104 and between server racks 106 and 110 are hot aisles, while the other aisles are cold aisles. Thus, input faces of server racks 104 and 106 face each other, while output faces of server racks 102 and 104 and 106 and 110 face each other.

Figure 2:
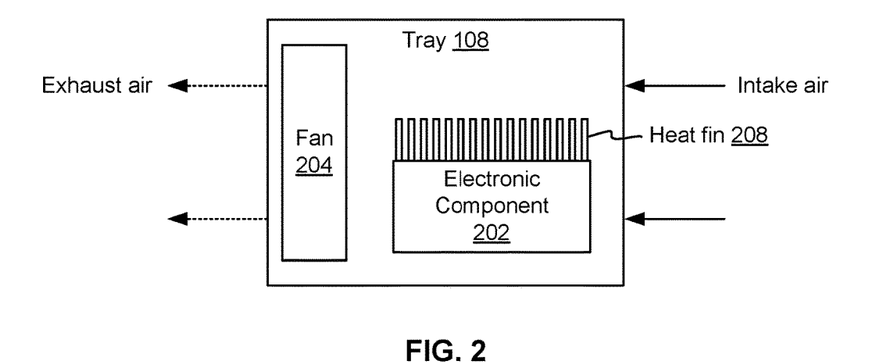
FIG. 2 is a block diagram of a tray in a server rack.

FIG. 2 is a block diagram of a tray in a server rack. Tray 108 can be installed inside server rack 110 (as well as any of the other server racks in FIG. 1), and a stack of trays can be provided in a server rack. Electronic components in the tray tend to generate heat, which can degrade performance. Components in the tray can be cooled using the compressed air and lattice structure cooling techniques described below, but first a conventional cooling technique for tray 108 will be described.

With respect to a conventional cooling technique, tray 108 may include one or more electronic components 202 (here, for simplicity, only a single electronic component is shown) and a fan 204. The operation of the fan causes air to be taken in as shown by the arrows (e.g., cool air from a cold aisle may be drawn into the tray), which cools electronic component 202 as the air passes through the interior of the tray. The air, which has been heated by electronic component 202, is then expelled as exhaust air (e.g., to a hot aisle). A heat fin 208 may be provided on or near electronic component 202 to help with cooling electronic component 202.

Figure 3:
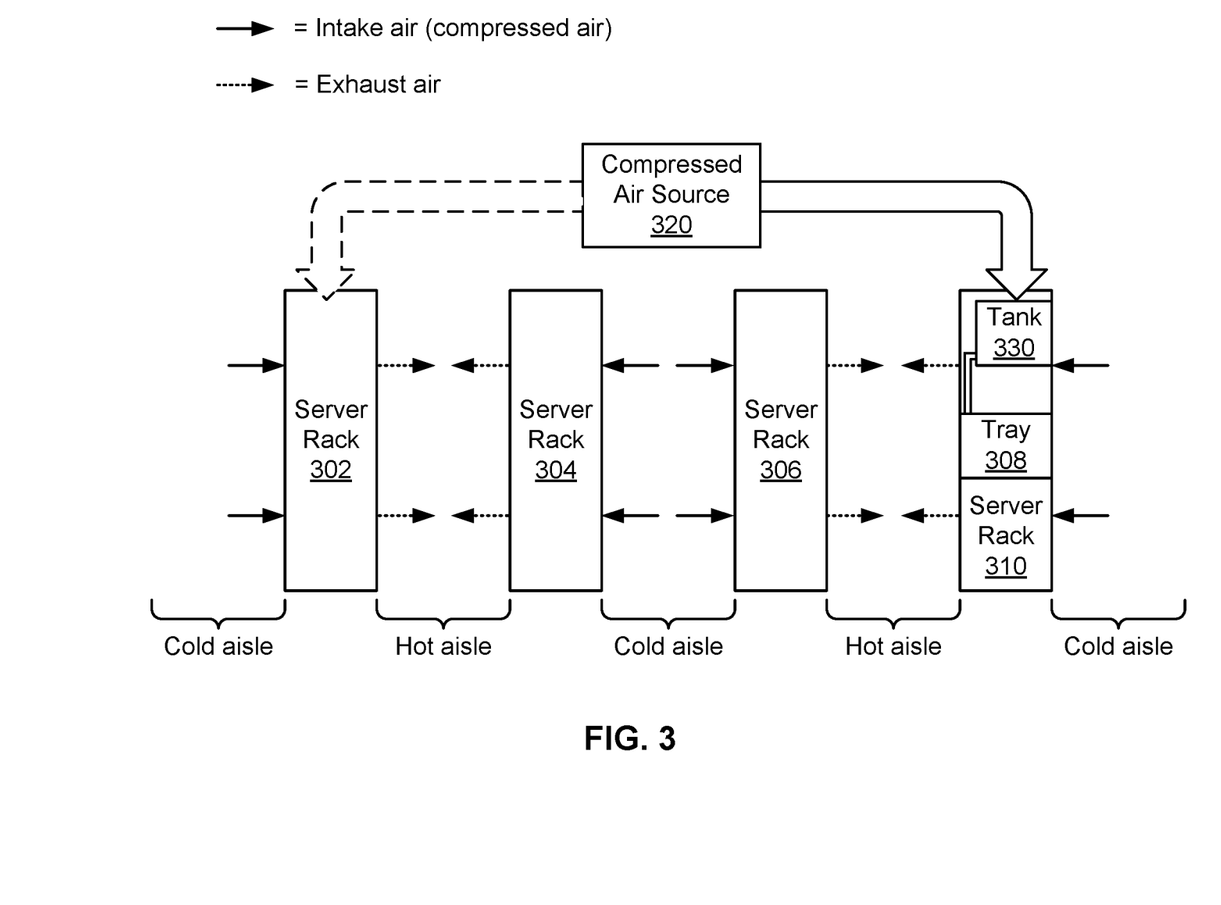
FIG. 3 is a block diagram of a data center with a compressed air system according to an embodiment.
Figure 4:
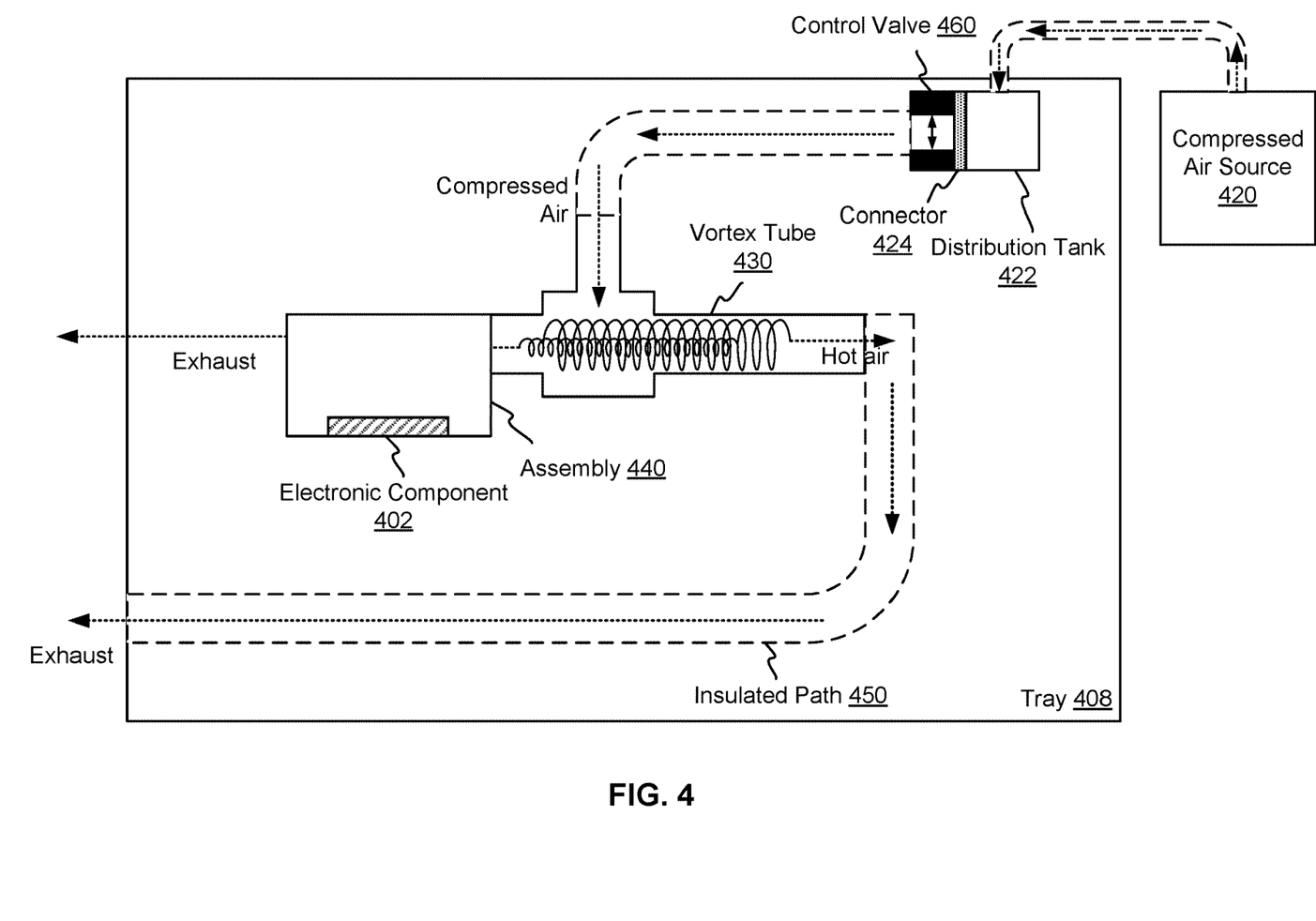
FIG. 4 is a block diagram of a server tray in which compressed air and lattice structure cooling is provided according to an embodiment.

For many electronic components, this type of convection cooling using ambient air is sufficient. However, as electronic components (such as server chips) become more computationally powerful, they also tend to generate more heat, and simple convection cooling does not maintain an ideal operating temperature range for many electronic components. In addition, fans tend to block air, generate their own heat, and add extra weight and complexity (e.g., moving parts) to a server assembly, which can increase operating costs. FIGS. 3 and 4 show an example of a data center, server assembly, and tray that use compressed air and a lattice structure to cool electronic components, which provides increased cooling compared to traditional convection cooling and also removes the need for a fan in the tray.

FIG. 3 is a block diagram of a data center with a compressed air system according to an embodiment. This figure is an example where the compressed air is compressed by a compressed air source 320. In this example, from the perspective of server racks 302-310, the compressed air source is a remote air compressor.

In some embodiments, such as the example shown here, the compressed air source is adapted to deliver compressed air to several server racks. Compressed air is cooler as it expands than ambient air, so cooler air is delivered to the server racks, taken into the trays of the server racks, passes over electronic components in the trays to cool the components, and exits to the hot aisles. The compressed air of the compressed air source can be delivered via outlets or vents in the compressed air source apparatus and/or delivered to the server racks via a conduit such as a hose, pipe, or other apparatus, which may be rigid or flexible. In some embodiments, the exhaust air in the hot aisles is recirculated, for example, taken in by compressed air source 320, cooled, and the process of delivering compressed air to the server racks is repeated. The compressed air source can be implemented using one or more air compressors. In some embodiments, compressed air source 320 includes a component that filters/reduces moisture in the discharged air. For example, a filter, a water trap, a desiccant, and/or a refrigerated air dryer may be utilized.

Here, compressed air source 320 compresses intake air (such as ambient air) and provides the compressed air to several server racks 302-310 via distribution tank(s) 330. For simplicity, a single distribution tank 330 is shown, but each of the other server racks 302-306 may have its own distribution tank. In the example shown, compressed air from compressed air source 320 is delivered to distribution tank 330. The tank is adapted to store and distribute the compressed air according to server rack needs such as temperature or load of electronic components in the server rack. The amount of air distributed can be controlled based on factors and using regulating mechanisms as further described below. In this example, tank 330 is coupled to tray 308 via a conduit such as a hose, pipe, or other apparatus, and compressed air is delivered to the tray via the conduit.

In some embodiments, a compressed air source is adapted to deliver compressed air to a specific server or tray within a server in a one-to-few or one-to-one relationship. For example, the compressed air source can be integrated with a server rack associated with a group of servers and be configured to deliver compressed air directly into (or over a relatively short distance into) the trays of the server rack in which the compressed air source is provided.

In the example shown, compressed air source 320 is depicted as being remote from the server racks. In some embodiments, instead of being compressed remotely, the air is compressed locally (relative to the server rack(s)). For example, a supercharger can be provided per server rack or per tray to cool air locally.

In various embodiments, an assembly for providing compressed air cooling to an electronic component includes an input configured to receive compressed air. The compressed air may be directed to one or more electronic components that give off relatively more heat than other components inside the tray. For example, server chips may especially benefit from compressed air cooling because they tend to give off a great deal of heat. The cooler air may be directed via a tube that focuses air to a desired direction or region. In various embodiments, the assembly also includes a heat conductive lattice structure through which an expansion of the compressed air is forced and a base configured to be coupled to an electronic component that is thermally cooled via the expansion of the compressed air.

FIG. 4 is a block diagram of a server tray in which compressed air and lattice structure cooling is provided according to an embodiment. Unlike the tray of FIG. 2, this figure shows an example where tray components are cooled by compressed air. The system shown in FIG. 4 includes a compressed air source 420, distribution tank 422, connector 424, control valve 460, vortex tube 430, and assembly 440. The system is adapted to cool electronic component 402. The air is compressed by a compressed air source 420. An example of compressed air source 420 is the compressed air source 320 described above. In some embodiments, air source 420 is shared among a plurality of different server rack components. In other embodiments, air source 420 is an individual air source for tray 408 that is not shared with other server rack trays. In an alternative embodiment, air source 420 is included in tray 408.

Tray 408 can be installed inside a server rack such as server rack 310, and a stack of trays can be provided in a server rack. FIG. 4 shows an example in which distribution tank 422 is provided inside the tray instead of outside (as in FIG. 3). Examples of tray 408 include a server, a storage device, a network device, a network switch, or any other rack mountable component. Electronic component 402 in the tray generates heat, which can negatively impact device performance and, consequently, the performance of the servers/data center as a whole. Components in the tray can be cooled using the compressed and lattice structure cooling techniques described below.

In various embodiments, compressed air source 420 is adapted to take in ambient air and pressurize the air. In the example shown, compressed air is distributed to distribution tank 422. Distribution tank 422 is adapted to store compressed air and deliver the compressed air to the system. When the compressed air is released via control valve 460, the air decompresses. The decompressing air released from control valve 460 is colder than ambient air because it expands and draws heat from the surroundings.

In some embodiments, the system shown in FIG. 4 includes a connector 424, which is adapted to permit the flow of compressed air to be quickly stopped. For example, connector 424 can be disengaged (e.g., snapped off) from distribution tank 422 so that the flow of compressed air to the rest of the system is stopped. In some embodiments, if a tray is removed (being removed, has been removed) from a server rack, the connector automatically engages to stop a flow of compressed air. The flow of compressed air to the removed tray is automatically stopped by connector 424 to conserve resources. The flow of compressed air can instead be re-directed to other server racks or trays that are still installed. Also, when the server rack is being serviced, the automatic stopping of the compressed air makes it easier for a technician to check the server rack. The flow of compressed air can be automatically stopped for a variety of reasons including, without limitation, due to a fault, error, or emergency. Conversely, connector 424 can (instead or also) be configured to initiate a flow of compressed air if a tray is plugged (being plugged, has been plugged) into a server rack. For example, when a tray is inserted into its slot in the server rack, the flow of compressed air can be initiated. This makes it easier for a technician to complete servicing of the server rack without needing to take additional steps to re-initiate flow of compressed air. A sensor can be provided in the server rack and/or the tray to detect whether a tray has been removed or inserted into the server rack. The sensor signal can be sent to a controller associated with compressed air source 420 to stop or start the flow of compressed air along a path to the tray in question.

Control valve 460 is adapted to control and regulate the amount (flow) of compressed air distributed to the system (including to the electronic component). The amount of airflow can be varied by changing the opening size of the control valve. In the example shown in FIG. 4, the size of the opening of control valve 460 can be varied in the direction of the arrows to increase or decrease the amount of air introduced to the rest of the system. This control valve is merely an example, and other control valves that control air flow in other ways (e.g., vary size in different directions or dimensions) can be used instead.

The control valve can be computer-controlled. For example, a computer can instruct the control valve to introduce varying amounts of compressed air to the electronic component based on a state of the electronic component. The state of the electronic component can be reported by the component itself or can be measured by sensors in the tray/server rack. For example, a load or temperature of the electronic component can be used by the computer to determine the amount of compressed air to distribute to the electronic component via the control valve. More air can be directed to an electronic component with a relatively high load or temperature. In some embodiments, the control valve is implemented by a proportional valve that uses the least amount of compressed air possible to provide adequate cooling for one or more tray components.

In the example shown, vortex tube 430 is adapted to receive compressed air from an air compressor such as 420 (here via distribution tank 422 and control valve 460). The vortex tube is adapted to spin the air to further cool the air and deliver the cold air out of the tube. This figure shows an example where vortex tube 430 is coupled to the input (here, the input includes distribution tank 422 and connector 424). In the example shown, compressed air is introduced to the top of the vortex tube, travels along the inside of the tube, and is delivered to assembly 440. In various embodiments, the vortex tube is configured to spin a source compressed air to provide a colder compressed air to the input of assembly 440 and exhaust a warmer air. In other words, there is a temperature gradient going from colder air to warmer air so that the coldest air is at the center of the tube and the hottest air is at the outer circumference of the tube. Here, colder air is spun through the center and exits into assembly 440, while warmer air is spun out (directed away from the electronic component) and exits via insulated path 450 out the tray.

Although not shown, heat fins may be provided inside at least a portion of the vortex tube to further cool the air passing through the tube. The vortex tube can be made of a variety of materials. In some embodiments, the tube is rigid, for example, made of copper, steel, or other metal or composite. In some embodiments, the tube is flexible, for example, made of nylon, polyethylene, PVC, or any other elastomer or flexible polymer.

In various embodiments, a cooler output of vortex tube 430 is input to assembly 440. In some embodiments, assembly 440 includes a port configured to receive the output of vortex tube 430, a heat conductive lattice structure, and a base configured to be coupled to electronic component 402 and thermally coupled to the heat conductive lattice structure. In various embodiments, air passing through assembly 440 is cooled by allowing the air to expand (e.g., air expanding in a heat conductive lattice structure). In some embodiments, assembly 440 includes a fractal spreader through which output air from vortex 430 is passed before being allowed to expand in a heat conductive lattice structure. An example of an assembly is as further described with respect to FIGS. 5A-5D. In some embodiments, assembly 440 is coupled to electronic component 402. In the example shown, at least a portion of assembly 440 is contacting the electronic component.

In operation, compressed air source 420 compresses air and delivers the compressed air to tray 408. The compressed air can be held/stored in distribution tank 422. Airflow can be managed by control valve 460, which controls the amount of air delivered to vortex tube 430 depending on a desired level of cooling. Distribution tank 422 stores compressed air and can provide more or less compressed air depending on control valve 460. The amount of cooling to be provided (or amount of air to be delivered) may be determined by a computer based on a load on electronic component 402, or a temperature of the electronic component or inside the tray, among other factors. Vortex tube 430 receives compressed air and cools the compressed air further by spinning the air such that cold air exits through one end of the vortex tube coupled to assembly 440 as shown. Here, an assembly is coupled to the vortex tube. Here, assembly 440 has a base coupled to the electronic component. In this example, the cooler air closer to the center of the vortex tube is directed to the electronic component. The warmer exhaust air exits through another end of the vortex tube, is routed via insulated path (tube) 450, and exits out the tray. In various embodiments, path 450 is insulated to prevent heating of the tray due to the exhaust air of the vortex traveling through the tray on its way out of the tray.

Upon cooling electronic component 402, the exhaust air of assembly 440 is expelled from tray 408 via the example path shown. In some embodiments, like the exhaust air of the vortex tube, the exhaust of the assembly is simply delivered out of the tray to a hot aisle. In some embodiments, the exhaust air can be used to cool other components. Although the exhaust air of the assembly is not as cool as the air entering the assembly, it may nevertheless be efficient to use the air to cool other components which might not heat up as much as electronic component 402 or require less cooling than electronic component 402. For example, electronic component 402 can be a server chip that generates more heat than other components. The coolest or cooler compressed air can be directed to electronic component 402 while relatively warmer air is directed to other components to provide cooling to the other components. For example, the compressed air expanded in the assembly may be directed into a system chassis to cool a different component within the system chassis.

The various movements of the air described above can also entrain ambient air because moving the compressed air or exhaust air draws additional (ambient) air into the tray along with the compressed air. In this example, the air from the right side of the diagram (e.g., from a cold aisle) may be pulled into the tray. For example, the warmer exhaust air of the vortex tube may be used to entrain ambient air into a system chassis that includes the assembly. As another example, the compressed air expanded in the assembly may be directed to entrain ambient air into a system chassis that includes the assembly. This can help to further cool the tray. The additional entrained air can also help to cool interior tray components such as electronic component 402 and other components.

Unlike the tray of FIG. 2, compressed air cooling can provide more cooling (lower temperatures and/or higher volume) than conventional cooling techniques. In one aspect, compressed air provides sufficient cooling in the tray so that a fan is not required. This is an advantage over conventional cooling methods because this reduces the weight, complexity, and operational cost of servers.

The number and placement of the components is merely exemplary and not intended to be limiting. For example, in some embodiments, control valve 460 is provided before connector 424 and next to distribution tank 422 rather than the configuration shown in FIG. 4. Distribution tank 422 is depicted as being part of the tray while compressed air source 420 is outside the tray. In alternative embodiments, distribution tank 422 is also outside the tray or both the distribution tank and the compressed air source are inside tray 408.

Figure 5A:
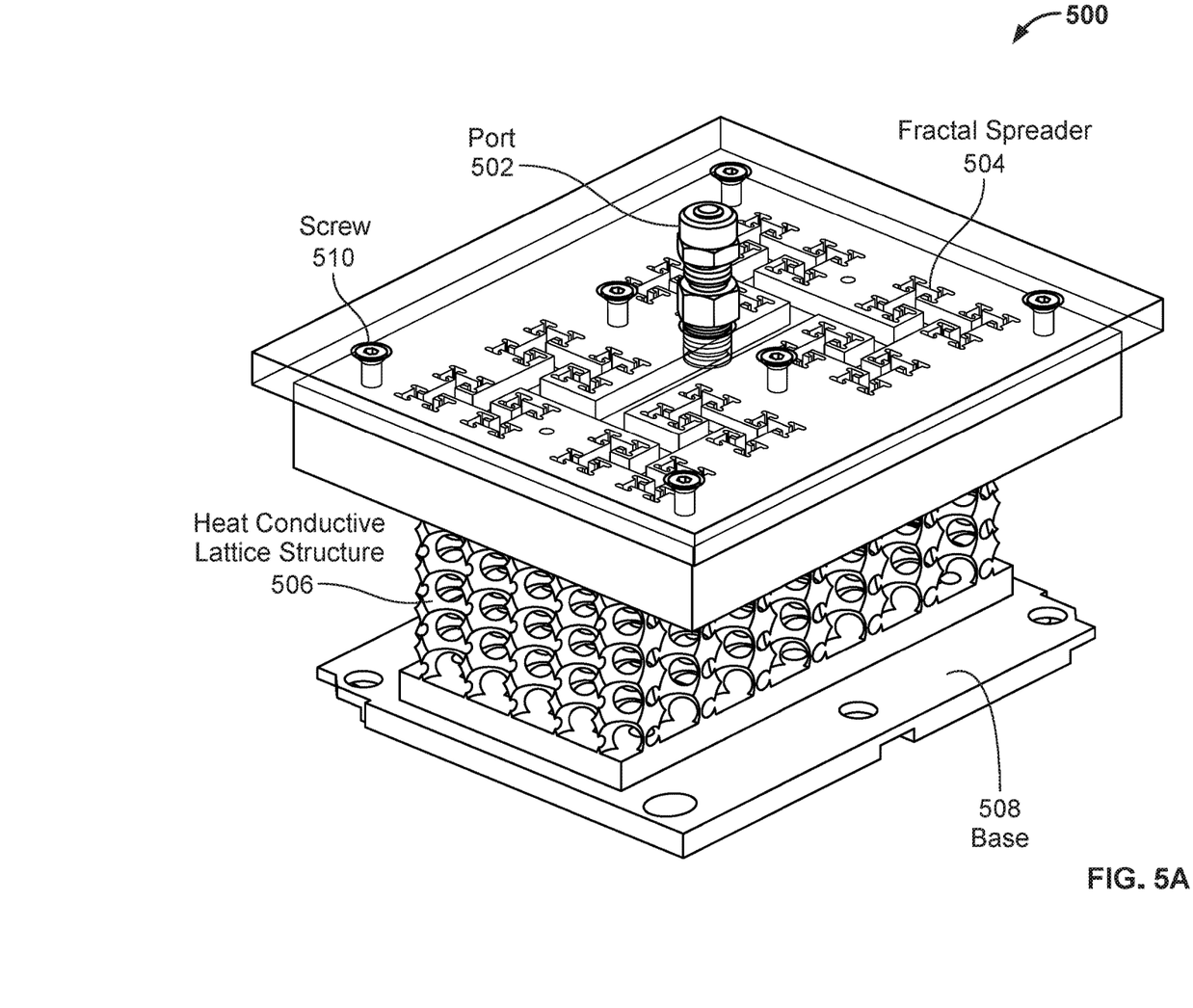
FIG. 5A is an illustration of an example assembly that includes a port, a fractal spreader, a heat conductive lattice structure, and a base.

FIG. 5A is an illustration of an example assembly that includes a port, a fractal spreader, a heat conductive lattice structure, and a base. The assembly of FIG. 5A (assembly 500) includes port 502, fractal spreader 504, heat conductive lattice structure 506, and base 508. In some embodiments, assembly 500 corresponds to assembly 440 of FIG. 4. In some embodiments, port 502 is configured to receive compressed air from vortex tube 430 of FIG. 4. Port 502 can be made of a variety of materials (e.g., steel, some other metal, a composite, etc.). In various embodiments, port 502 is fitted with a connector (e.g., a cap) that facilitate fitting of a tube providing air (e.g., vortex tube 430 of FIG. 4).

In the example shown, port 502 provides air (e.g., compressed air) to fractal spreader 504. As shown, fractal spreader 504 includes a block with an airflow pathway network carved out of the block. This block is illustrated in further detail in FIG. 5C. The block be can be made of a variety of materials (e.g., steel, some other metal, a composite, etc.). In various embodiments, air flows through the airflow pathway network to exits facing heat conductive lattice structure 506. In the example shown, fractal spreader 504 includes a top slab attached to the block with airflow pathways. The top slab prevents air from escaping fractal spreader 504, directing air to only leave through exits facing heat conductive lattice structure 506. In the example shown, this top slab is fastened to the bottom block with screws (e.g., screw 510). The top slab can be made of a variety of materials (e.g., acrylic, plexiglass, polycarbonate, nylon, polyethylene, PVC, etc.). The top slab may also be bonded to the bottom block without screws. It is also possible to have a single block for fractal spreader 504 with airflow pathways carved within the block and not visible from the outside. In some embodiments, port 502 distributes air to heat conductive lattice structure 506 without first passing through an air flow spreader such as fractal spreader 504. The benefits of using fractal spreader 504 are described in further detail below (see FIG. 5C). In the example shown, fractal spreader 504 employs an H-fractal pattern of airflow pathways. This H-fractal pattern is described in further detail below (see FIGS. 5C and 5D).

In the example shown, heat conductive lattice structure 506 is positioned beneath fractal spreader 504. In some embodiments, heat conductive lattice structure 506 is attached to fractal spreader 504 and/or base 508 with one or more points of contact to limit and/or prevent movement of the components of assembly 500. As shown, heat conductive lattice structure 506 includes open-cell voids through which heat can be transferred away from assembly 500. Heat conductive lattice structure 506 can be made of a variety of materials. For example, heat conductive lattice structure 506 can be made of aluminum or an alloy thereof. In some embodiments, buildup of aluminum oxide, which does not conduct heat as well as aluminum, is removed from heat conductive lattice structure 506 (e.g., by acid etching). Materials other than aluminum may also be used to make heat conductive lattice structure 506 (e.g., copper, diamond, synthetic diamond, diamond copper-tungsten, silicon carbide in an aluminum matrix, diamond in a copper-silver alloy matrix, beryllium oxide in a beryllium matrix, etc.). Aluminum and these other materials have high thermal conductivity, allowing for efficient conduction transfer of heat. In some embodiments, heat conductive lattice structure 506 is also plated (e.g., with nickel, chrome, etc.). Plating can be done, for example, to inhibit corrosion.

In various embodiments, heat conductive lattice structure 506 is thermally coupled to base 508, and base 508 is coupled to an electronic component to be cooled (e.g., electronic component 402 of FIG. 4). The electronic component (not shown in FIG. 5) may be a computer chip coupled to base 508 and enclosed within heat conductive lattice structure 506. In various embodiments, compressed air is forced through heat conductive lattice structure 506 to cool the electronic component. Base 508 can be made of a variety of materials (e.g., copper, aluminum, circuit board materials, etc.). In some embodiments, base 508 is a circuit board to which an electronic component to be cooled is coupled. The base in FIGS. 5A and 5B (base 508) is merely an example, and other structures to which an electronic component (to be cooled) is coupled and to which heat conductive lattice structure 506 is thermally coupled are possible. These other structures do not need to have the form or appearance of base 508. Furthermore, port 502, fractal spreader 504, and heat conductive lattice structure 506 are also merely examples and will vary in configuration (e.g., dimensions) in different embodiments.

Figure 5B:
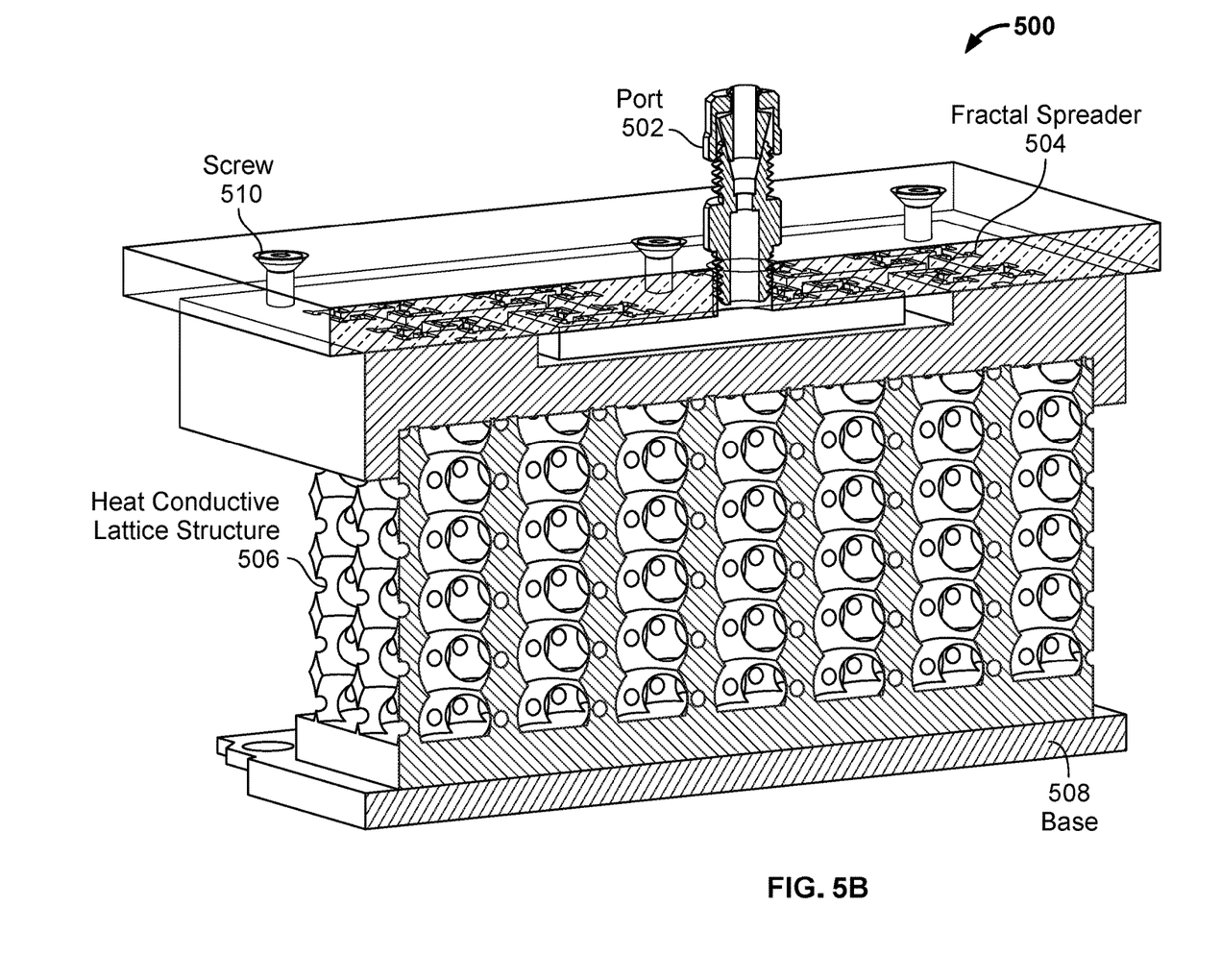
FIG. 5B shows an alternative view of the example assembly of FIG. 5A.

FIG. 5B shows an alternative view of the example assembly of FIG. 5A. FIG. 5B shows a cross-sectional view of port 502, fractal spreader 504, heat conductive lattice structure 506, base 508, and screw 510 of assembly 500 of FIG. 5A. FIG. 5B provides a clearer view of the airflow pathways within fractal spreader 504 and the open-cell voids of heat conductive lattice structure 506. The electronic component to be cooled (e.g., electronic component 402 of FIG. 4) is not shown.

Figure 5C:
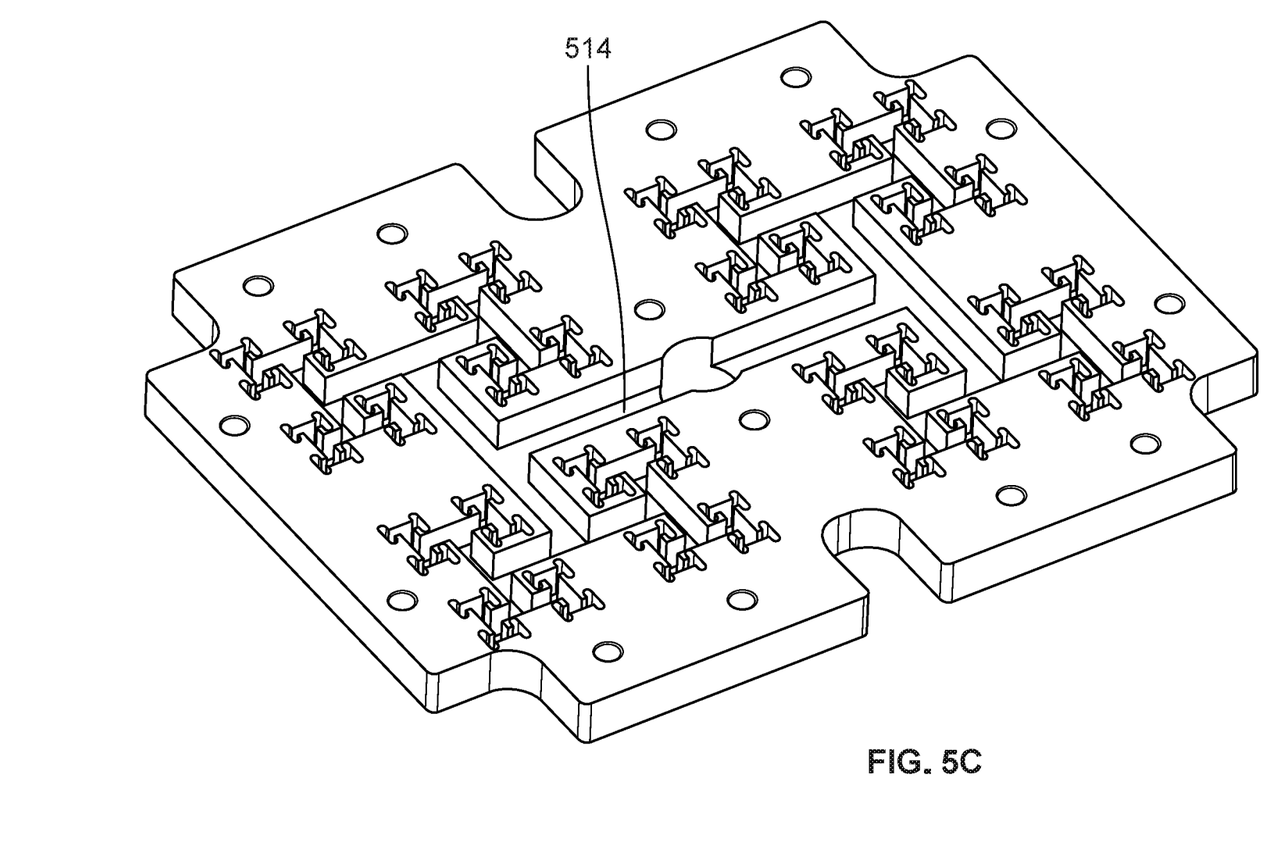
FIGS. 5C and 5D illustrate an example fractal spreader.
Figure 5D:
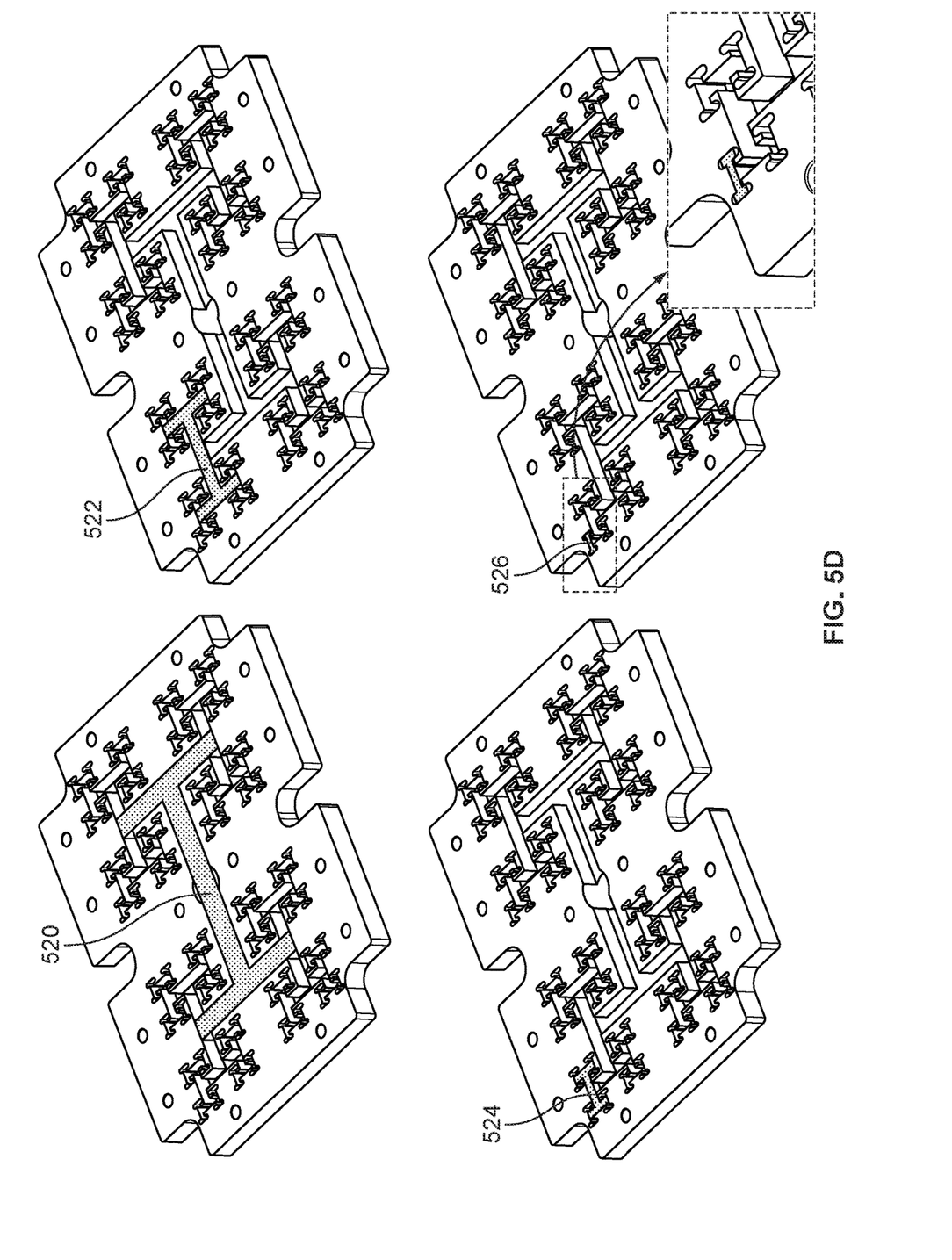

FIGS. 5C and 5D illustrate an example fractal spreader. FIG. 5C shows an example of a portion of fractal spreader 504. Specifically, FIG. 5C shows an example of a bottom block of fractal spreader 504 in which air from port 502 flows through airflow pathways 514. Airflow pathways 514 follow an H-fractal pattern. Stated alternatively, airflow pathways 514 follow a pattern constructed by starting with line segments corresponding to a capital letter H (representing a first fractal level, e.g. first fractal level 520 of FIG. 5D) and then iteratively placing smaller Hs centered at the top and bottom of each free vertical segment such that the outlet port locations correspond to the top and bottom of each free vertical segment of each of the smallest Hs in the H-fractal pattern (e.g., of the Hs in fourth fractal level 526 of FIG. 5D). The fractal spreader of FIG. 5C has an H-fractal pattern with four fractal levels. FIG. 5D shows the different fractal levels of the fractal spreader of FIG. 5C using dark illustrative lines (tracing out Hs). The fractal pattern starts with first fractal level 520 in the center of the fractal spreader. Second fractal level 522 (illustrated with an example H in the upper left corner) includes Hs formed off of the first fractal level's H. Third fractal level 524 is illustrated with an example H formed off of the second fractal level H illustrated. Fourth fractal level 526 is illustrated with an example H formed off of the third fractal level H illustrated.

In the example shown, there are four fractal levels. In various embodiments, outlet ports that blow air downward to heat conductive lattice structure 506 are positioned to correspond to the top and bottom of each free vertical segment of each of the smallest Hs. With four fractal levels, this means there would be 256 such outlet ports (4 outlet ports for each of the 64 smallest Hs). A design with more outlet ports is also possible (e.g., 1024 outlet ports if there are five fractal levels). The locations of the outlet ports can be adjusted by adjusting dimensions of the H shape that is replicated (e.g., adjusting length of the vertical and/or horizontal segments). The dimensions of the Hs may also be changed so that the dimensions are different at different fractal levels.

A property of the fractal pattern of airflow pathways 514 is that each terminus (corresponding to each outlet port) faces the same or substantially the same (any discrepancies may be due to physical construction imperfections) air flow resistance to the source (e.g., where port 502 is located). This is due to each pathway to each terminus being the same (or substantially the same) air travel distance from the source and the path (e.g., in terms of dimensions of air corridors) being the same (or substantially the same) from the source to each terminus. A benefit of this property is that because the air flow resistance from source to each outlet port is the same (or substantially the same), the air coming out of each outlet port is the same (or substantially the same) pressure, allowing for a more uniform distribution of air to heat conductive lattice structure 506, which promotes clearer laminar flow. The pattern of airflow pathways 514 is merely an example, and other patterns are also possible. For example, other fractal patterns can be used. Various shapes (not necessary an H shape) can be made to recur at progressively smaller scales.

A benefit of having an air flow spreader between port 502 and heat conductive lattice structure 506 is higher pressure of air delivered to heat conductive lattice structure 506. Higher pressure promotes more heat transferred from an electronic component to be cooled and more efficient dissipation of heat. A potential advantage of heat conductive lattice structure 506 is increased surface area for heat transfer provided by heat conductive lattice structure 506.

Although the foregoing embodiments have been described in some detail for purposes of clarity of understanding, the invention is not limited to the details provided.

There are many alternative ways of implementing the invention. The disclosed embodiments are illustrative and not restrictive.

What is claimed is:

1. An assembly, comprising:
    a heat conductive lattice structure with open-cell voids;
    a port configured to provide compressed air that is directed toward the heat conductive lattice structure;
    an air flow spreader configured to receive the compressed air provided via the port and distribute the compressed air through one or more airflow pathways to one or more outlets facing the heat conductive lattice structure, wherein the one or more airflow pathways are in a configuration in which an airflow pathway pattern recurs in substantially similar form at progressively smaller scales; and
    a base configured to be coupled to an electronic component and thermally coupled to the heat conductive lattice structure.

2. The assembly of claim 1, wherein the airflow pathway pattern is associated with an H-tree fractal.

3. The assembly of claim 1, wherein the port has a substantially similar air flow resistance to each of the one or more outlets.

4. The assembly of claim 1, wherein the air flow spreader includes a fractal airflow pathway network.

5. The assembly of claim 1, further comprising a vortex tube coupled to the port, wherein the vortex tube is configured to spin a source of the compressed air to provide a colder compressed air to the port and exhaust a warmer exhaust air.

6. The assembly of claim 1, wherein the heat conductive lattice structure is made, at least in part, of aluminum or an alloy thereof.

7. The assembly of claim 6, wherein the heat conductive lattice structure has undergone an aluminum-oxide removal process.

8. The assembly of claim 1, wherein the heat conductive lattice structure has been plated.

9. The assembly of claim 1, wherein the open-cell voids are of substantially similar size and are of substantially similar distance apart from one another.

10. The assembly of claim 1, wherein the electronic component is an integrated circuit chip.

11. The assembly of claim 1, wherein the compressed air is compressed by an air compressor external to a server rack.

12. The assembly of claim 1, further comprising a distribution tank configured to store the compressed air and deliver the compressed air to the port.

13. The assembly of claim 1, further comprising a connector configured to automatically stop a flow of the compressed air in response to a tray being removed from a server rack and/or to automatically initiate the flow of the compressed air in response to the tray being plugged into the server rack.

14. The assembly of claim 1, further comprising a control valve configured to control an amount of the compressed air distributed to the electronic component.

15. The assembly of claim 14, wherein the control valve is computer-controlled.

16. The assembly of claim 14, wherein the control valve is controlled based at least in part on at least one of: a load of the electronic component or a temperature of the electronic component.

17. The assembly of claim 1, wherein the base is coupled to the electronic component via a thermal paste.

18. A method, comprising:
    providing compressed air via a port;
    directing the compressed air toward a heat conductive lattice structure with open-cell voids;
    utilizing an air flow spreader to receive the compressed air provided via the port and distribute the compressed air through one or more airflow pathways to one or more outlets facing the heat conductive lattice structure, wherein the one or more airflow pathways are in a configuration in which an airflow pathway pattern recurs in substantially similar form at progressively smaller scales; and
    cooling, via the compressed air, an electronic component coupled to a base that is thermally coupled to the heat conductive lattice structure.

19. The method of claim 18, wherein the air flow spreader includes a fractal airflow pathway network.

20. An assembly, comprising:
    a heat conductive lattice structure with open-cell voids;
    a port configured to provide compressed air that is directed toward the heat conductive lattice structure;
    an air flow spreader configured to receive the compressed air provided via the port and distribute the compressed air through one or more airflow pathways to one or more outlets facing the heat conductive lattice structure, wherein the one or more airflow pathways are in a configuration associated with an H-tree fractal; and
    a base configured to be coupled to an electronic component and thermally coupled to the heat conductive lattice structure.

* * * * *